United States Patent
Lai

(12) 
(10) Patent No.: US 6,404,630 B1
(45) Date of Patent: Jun. 11, 2002

(54) FAN DUCT FOR HEAT DISSIPATION

(75) Inventor: Chung Tien Lai, Taipei (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/768,759

(22) Filed: Jan. 24, 2001

(30) Foreign Application Priority Data

Dec. 20, 2000 (CN) .................................... 89222125 U

(51) Int. Cl.[7] .................................................. H05K 7/20
(52) U.S. Cl. ...................... 361/697; 361/695; 257/718; 257/719; 257/722; 174/16.1; 174/16.3; 165/80.3
(58) Field of Search ................................. 361/687, 688, 361/689, 690–699, 704; 165/80.3, 104.33, 185; 174/15.1, 16.1, 16.3; 257/717–722, 727; 312/233.2; 454/184

(56) References Cited

U.S. PATENT DOCUMENTS

| | | | |
|---|---|---|---|
| 5,297,005 A | * | 3/1994 | Gourdine .................... 361/697 |
| 5,917,697 A | * | 6/1999 | Wang .......................... 361/695 |
| 6,160,704 A | * | 12/2000 | Rusate ........................ 361/697 |
| 6,199,624 B1 | * | 3/2001 | Wotring ...................... 165/80.3 |
| 6,236,565 B1 | * | 5/2001 | Gordon ....................... 361/695 |

* cited by examiner

Primary Examiner—Boris Chervinsky
(74) Attorney, Agent, or Firm—We Te Chung

(57) ABSTRACT

A fan duct (10) for heat dissipation includes a hollow clasp (14), a base (16), and a flexible pipe (12) connecting the hollow clasp and the base. The clasp includes a hollow first connecting portion (142) connected to an end of the flexible pipe, a hollow funnel portion (144), and an upper disc (145) attachable to a computer enclosure (50). The base has a body receiving a fan (30) therein. A pair of catches (164) depends from opposite sides of the body, to engage with a bottom surface of the fan. The base also has a hollow second connecting portion (166) connected to an opposite end of the flexible pipe, thereby attaching the fan duct to the fan. The flexible pipe is made of pliable material, so that its length and shape can be adjusted according to a particular inner configuration of the enclosure.

9 Claims, 5 Drawing Sheets

FAN DUCT FOR HEAT DISSIPATION

BACKGROUND

1. Field of the Invention

The present invention relates to a fan duct, and more particularly to a fan duct for heat dissipation which facilitates removal of heat from an electronic device by forced air convection.

2. Related Art

Developments in today's highly information-intensive society have led to remarkable improvements in performances of electronic devices. During operation of the devices, large amounts of heat are often produced. This can deteriorate operational stability. Typically, a heat sink is attached to an outer surface of an electronic device to facilitate removal of heat therefrom. A fan is often attached to the heat sink to provide forced convection therefrom. This kind of assembly has limited effectiveness, because most convected air stays inside a surrounding computer enclosure. As contemporary computers become smaller and smaller, less and less airspace is being provided inside computer enclosures. Dissipating heat merely within an enclosure is becoming less and less effective. Hence, air convection to space outside a computer enclosure has been developed.

U.S. Pat. No. 5,917,697 discloses a conventional heat dissipation assembly. A fan is attached to a heat sink, and a fan duct connects the fan to space outside a computer enclosure. Unfortunately, the fan duct is attached to the fan using screws, which is unduly complicated and cumbersome. Furthermore, the fan duct does not entirely cover the fan. Thus air easily leaks out, which lowers the efficiency of air convection.

An improved fan duct which overcomes the above problems of the related art is desired.

SUMMARY OF THE INVENTION

Accordingly, an object of the present invention is to provide a fan duct which is easily assembled.

Another object of the present invention is to provide a fan duct which increases heat convection efficiency.

To achieve the above-mentioned objects, a fan duct for heat dissipation of the present invention includes a hollow clasp, a base, and a flexible pipe connecting the hollow clasp and the base. The hollow clasp includes a hollow first connecting portion connected to an end of the flexible pipe, a hollow funnel portion, and an upper disc attachable to a computer enclosure. The base has a body receiving a fan therein. A pair of catches depends from two opposite sides of the body, to engage with a bottom surface of the fan. The base also has a hollow second connecting portion connected to an opposite end of the flexible pipe, thereby attaching the fan duct to the fan. The flexible pipe is made of pliable material, so that its length and shape can be adjusted according to a particular inner configuration of the enclosure.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
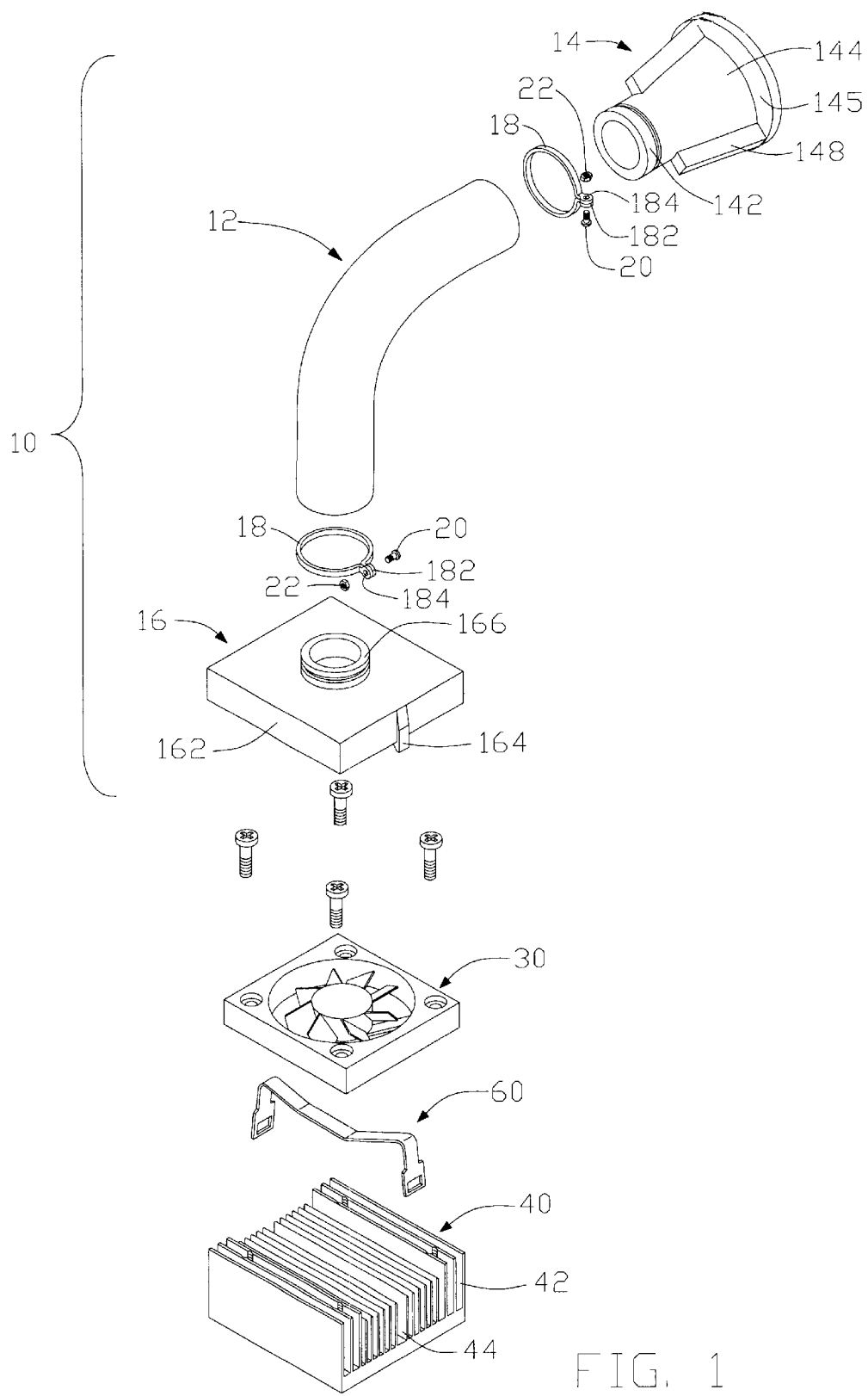
FIG. 1 is an exploded view of a fan duct in accordance with the present invention, together with a fan, a clip and a heat sink.

Referring to FIG. 1, a fan duct 10 in accordance with the present invention for engaging with a heat removing device comprises a hollow clasp 14, a flexible pipe 12, and a base 16. The heat removing device includes a heat sink 40 and a fan 30.

The hollow clasp 14 of the fan duct 10 includes a hollow first connecting portion 142 at a lower end thereof, a hollow coaxial funnel portion 144, and a coaxial upper disc 145. The funnel portion 144 has a pair of oppositely disposed symmetrical ribs 148 on an outer surface thereof, for facilitating manual attachment of the hollow clasp 14 to a computer enclosure 50 (see FIG. 3). The disc 145 has four protrusions 146 evenly distributed on an outer surface of the disc 145 (see FIG. 3). Each protrusion 146 has an engaging head (not labeled) at a distal end thereof. The flexible pipe 12 is made of pliable material, such that its length and shape can be adjusted according to a particular inner configuration of the enclosure 50.

The base 16 of the fan duct 10 includes a box-shaped body 162, a hollow second connecting portion 166 extending upwardly from the body 162, and a pair of catches 164 respectively depending from two opposite side walls (not labeled) of the body 162. The body 162 defines an inside space (not visible) for accommodating the fan 30 therein. The second connecting portion 166 is a columnar pipe, an interior of which communicates with the inside space of the body 162. Two fixing rings 18 are respectively used for tightening the connection between the flexible pipe 12 and the hollow clasp 14, and between the flexible pipe 12 and the base 16. Each fixing ring 18 defines a through hole 184 in each of two adjacent joint tabs 182 thereof. A screw 20 and a nut 22 secure each fixing ring.

Figure 3:
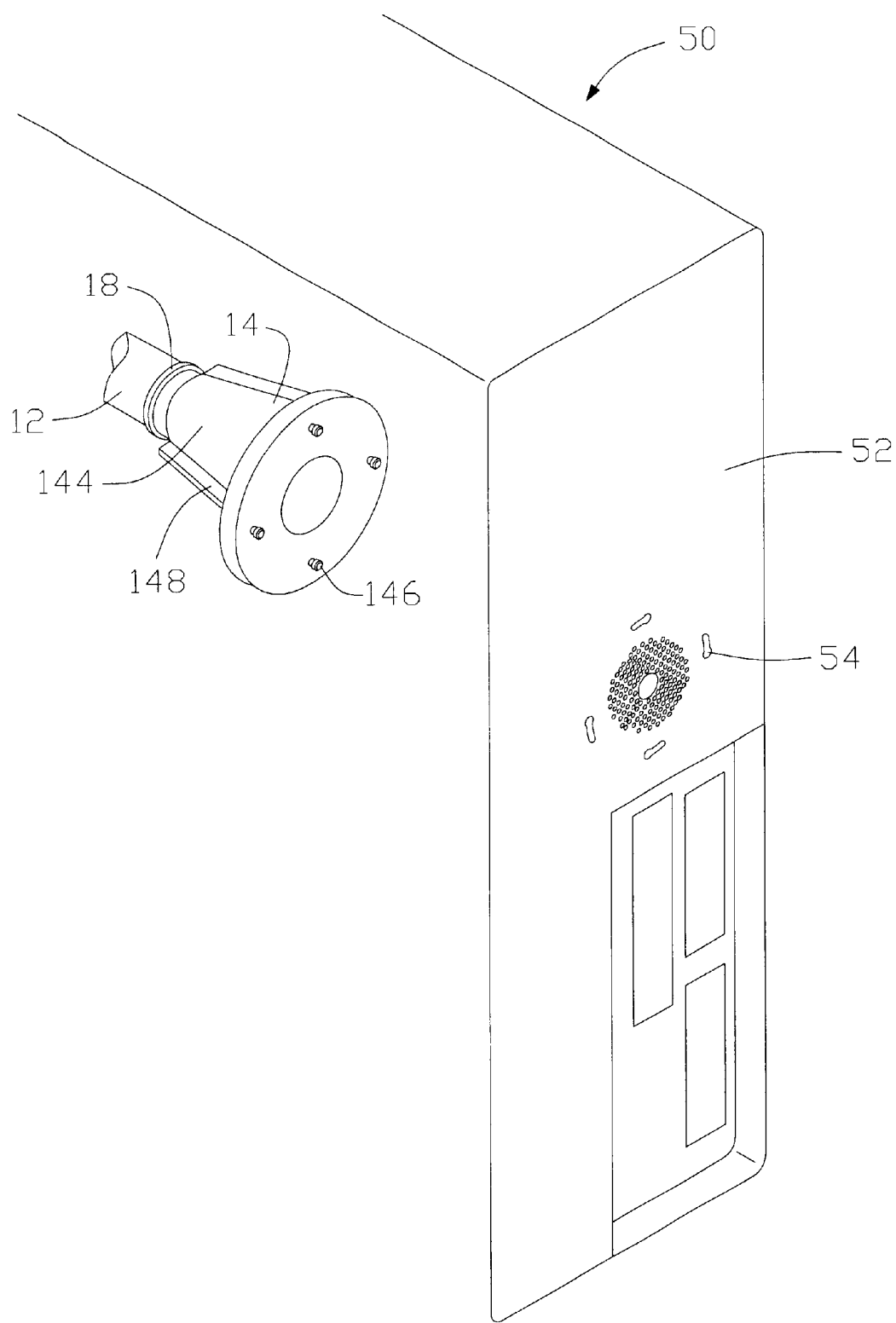
FIG. 3 is a perspective view of an upper portion of the fan duct of FIG. 1, ready for attachment to a rear panel of a computer enclosure.

The heat sink 40 of the heat removing device defines a channel 44 through a center of a plurality of fins 42 thereof, for receiving a clip 60 therein and for accommodating the catches 164 of the base 16 of the fan duct 10. Referring to FIG. 3, the computer enclosure 50 defines four locking slots 54 in a rear panel 52 thereof, corresponding to the four protrusions 146 of the hollow clasp 14.

Figure 2:
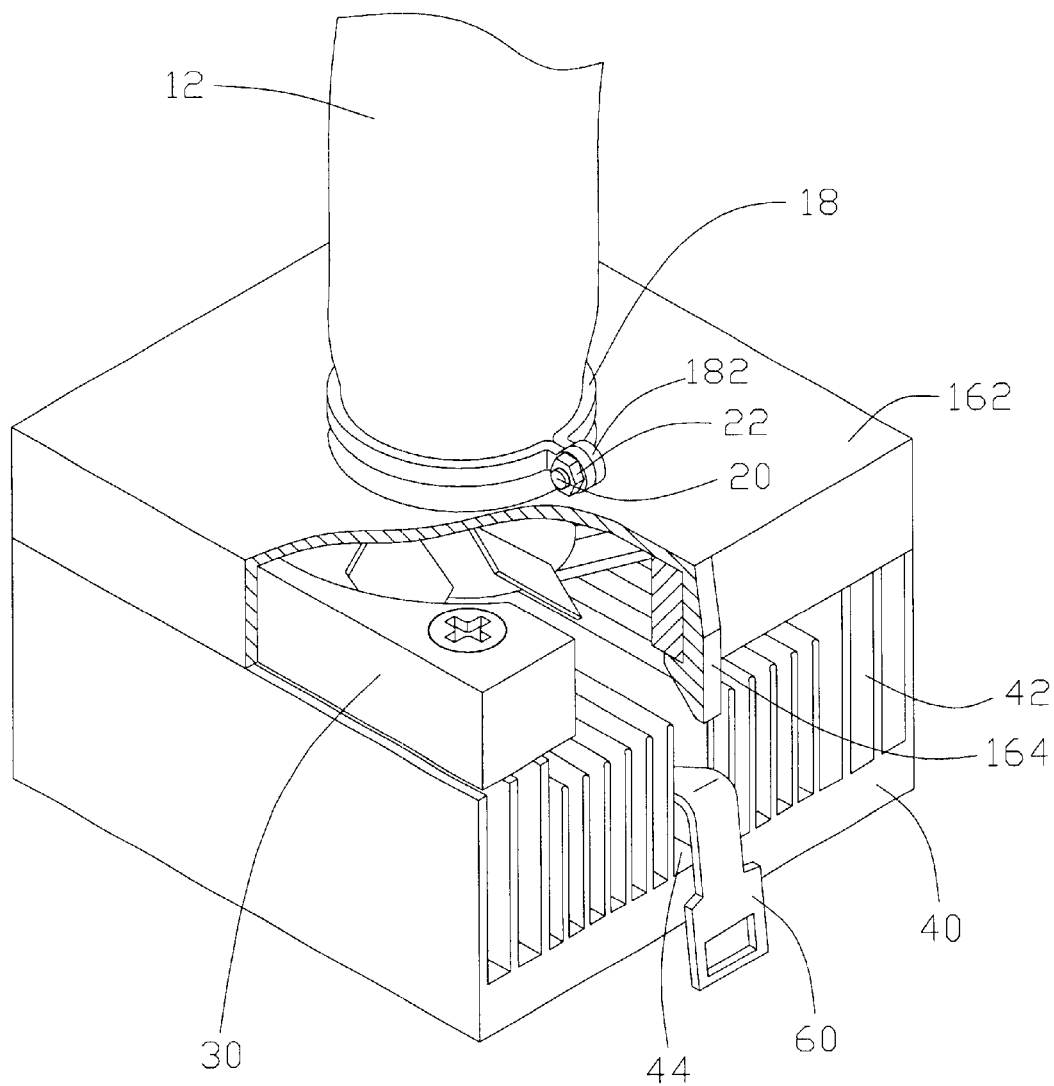
FIG. 2 is an assembled view of FIG. 1, partly cut away to better show the fan duct engaging with the fan.

Referring also to FIG. 2, in pre-assembly, the clip 60 is placed in the channel 44 of the heat sink 40. The fan 30 is attached to the heat sink 40 with a plurality of bolts (not labeled). The base 16 is placed over the fan 30, with the catches 164 of the base 16 engaging with a bottom surface of the fan 30. The catches 164 are thereby accommodated in the channel 44 of the heat sink 40. The second connecting portion 166 of the base 16 is connected to an end of the flexible pipe 12. One fixing ring 18 surrounds an overlap between the second connecting portion 166 and the flexible pipe 12. One screw 20 is extending through the through holes 184 of the fixing ring 18, to engage with one nut 22 and thereby tighten the fixing ring 18.

Figure 4:
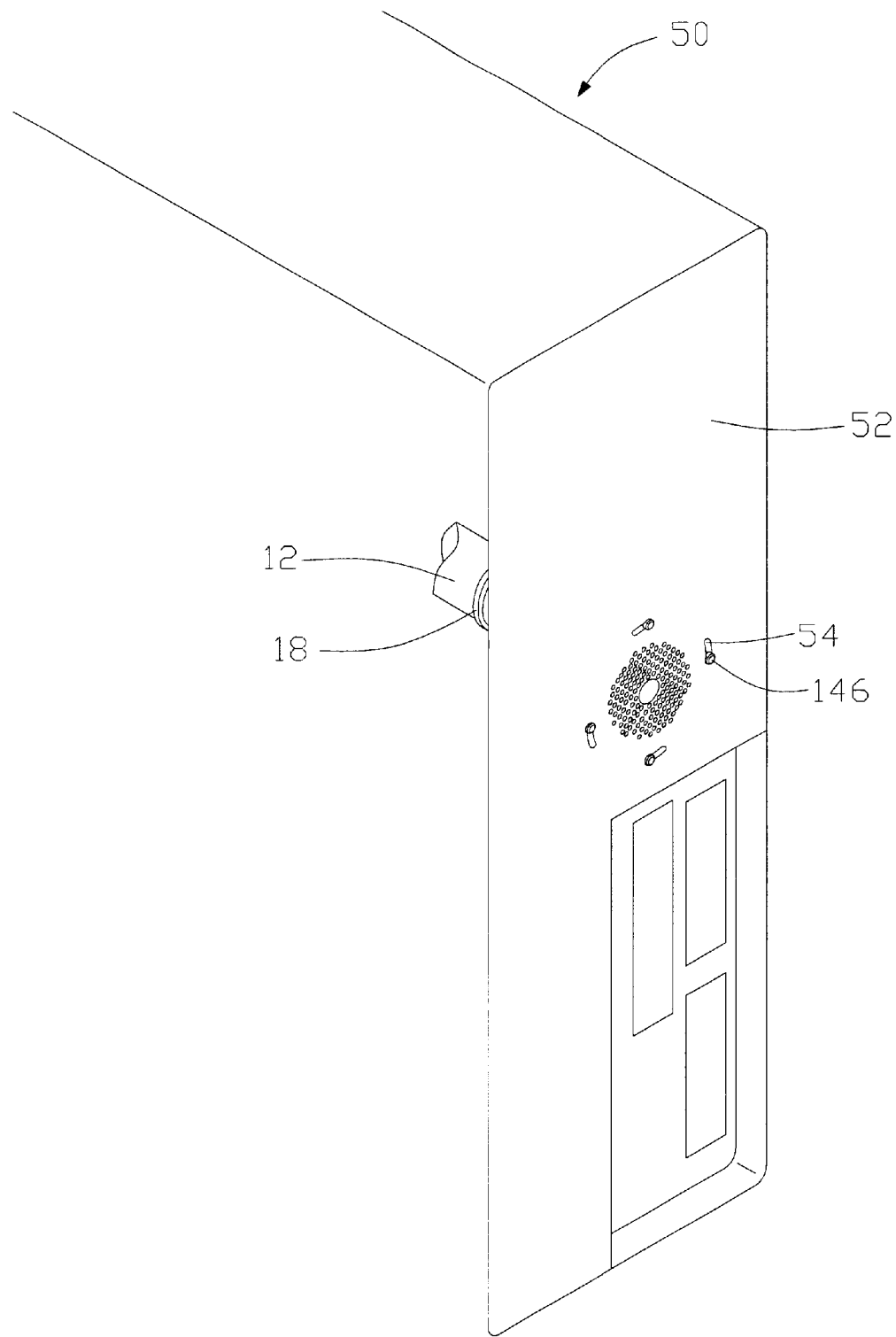
FIG. 4 is similar to FIG. 3, but showing the fan duct attached to the rear panel in an unlocked position.
Figure 5:
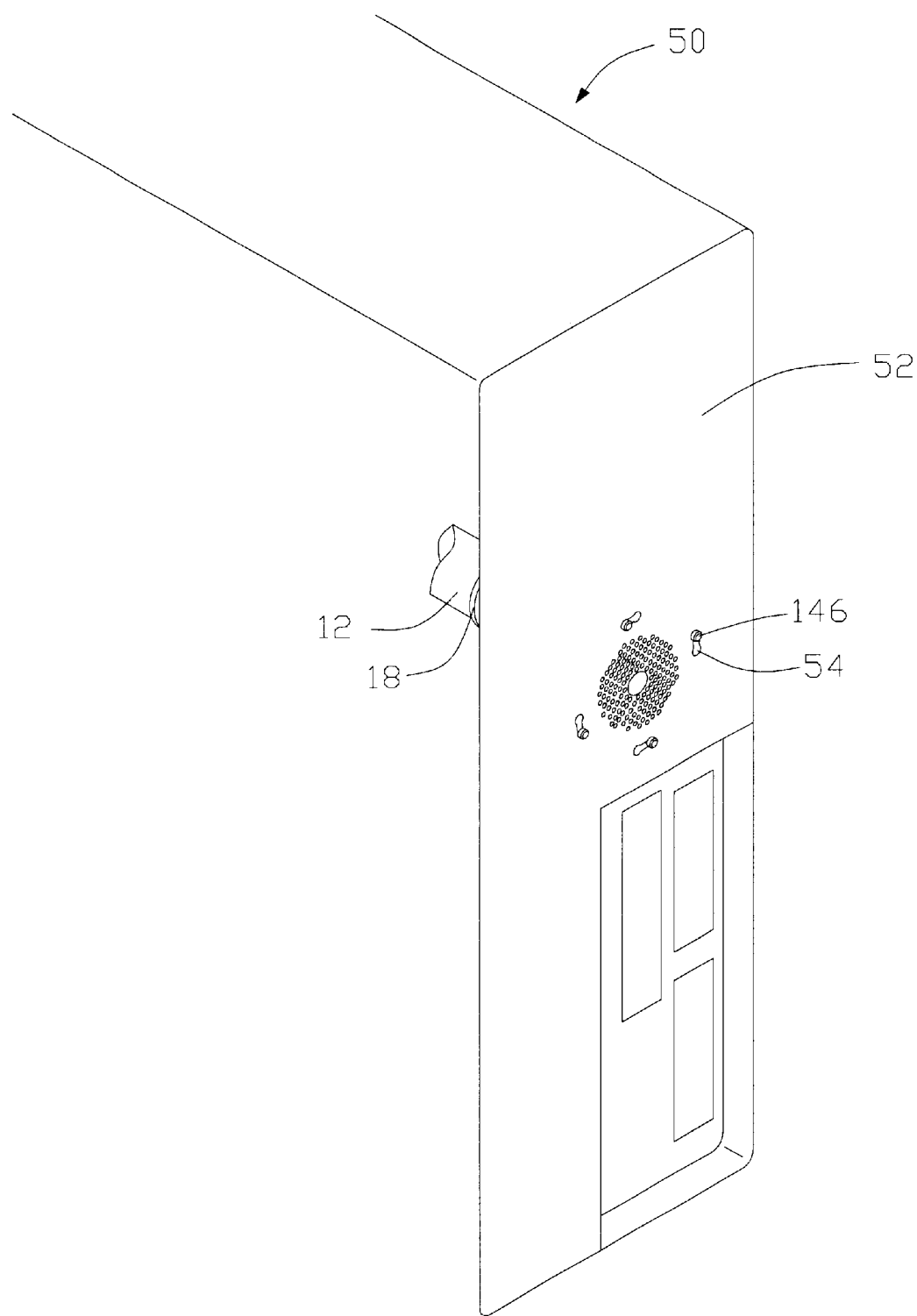
FIG. 5 is similar to FIG. 4, but showing the fan duct attached to the rear panel in a locked position.

Referring also to FIGS. 3–5, in assembly, the hollow clasp 14 is connected to an opposite end of the flexible pipe 12 in much the same way as the second connecting portion 166 is connected to an end of the flexible pipe 12. The protrusions 146 of the hollow clasp 14 are inserted into larger portions of the corresponding locking slots 54 of the rear panel 52 of the enclosure 50. The ribs 148 of the clasp 14 are rotated, causing the protrusions 146 to enter smaller portions of the locking slots 54. Thus the engaging heads of the protrusions 146 engage with the rear panel 52 at the smaller portions of the locking slots 54.

The fan duct 10 of the present invention includes the following advantages:

1. The fan duct 10 is connected to the fan 30 by the base 16 of the fan duct 10 engaging with the fan 30. Thus if the fan 30 is substituted with a fan of different size, only the base of the fan duct 10 needs to be changed. The remainder of the fan duct 10 is functional regardless of the size or configuration of the fan 30.

2. The fan duct 10 is easily and securely assembled, and is readily attached to the fan 30 and the rear panel 52 of the enclosure 50. The whole assembly and attachment process is simple.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A fan duct comprising:

a hollow clasp adapted to be attached to an enclosure such that the clasp is in communication with space outside the enclosure, the hollow clasp integrally comprising a hollow first connecting portion at a lower end thereof;

a base comprising a body defining space for accommodating a fan therein, a hollow second connecting portion, and a pair of catches depending from the base for engaging with the fan; and a flexible pipe engaged with the first connecting portion of the hollow clasp and the second connecting portion of the base, a fixing ring engagingly surrounding each overlapping portion of both ends of the flexible pipe and the first and second connecting portions.

2. The fan duct as described in claim 1, wherein the clasp further comprises a hollow funnel portion and an upper disc, the upper disc being rotatable and adapted to be attached to the enclosure such that the hollow clasp is in communication with space outside the enclosure.

3. The fan duct as described in claim 2, wherein at least one rib is formed on an outer surface of the funnel portion of the hollow clasp, for facilitating manual attachment of the hollow clasp to the enclosure.

4. The fan duct as described in claim 2, wherein a plurality of protrusions are formed on an outer surface of the disc, each protrusion having an engaging head.

5. The fan duct as described in claim 1, wherein the flexible pipe is made of pliable material, so that its length and shape can be adjusted according to a particular inner configuration of the enclosure.

6. The fan duct as described in claim 1, wherein each fixing ring defines a through hole in each of two joint tabs thereof, and wherein a screw is extended through each through hole to engage with a corresponding nut and thereby tighten the corresponding fixing ring.

7. A heat dissipation system, comprising:

a panel defining a plurality of locking slots, each locking slot having a large portion and a small portion;

a heat sink;

a fan attached to the heat sink; and a fan duct comprising a hollow clasp, a base, and a flexible pipe connecting the hollow clasp and the base, the flexible pipe being made of pliable material so that its length and shape can be adjusted according to a particular inner configuration of a computer enclosure, the hollow clasp comprising a hollow first connecting portion connected to an end of the flexible pipe, a hollow funnel portion, and an upper disc, the upper disc forming a plurality of protrusions each having an engaging head, the protrusions being inserted into the corresponding large portions of the locking slots of the panel and then rotatingly slidable into the corresponding small portions of the locking slots to thereby attach the fan duct to the panel, the base comprising a body defining an inside space for accommodating the fan therein and two catches depending from opposite side walls of the body for engaging with a bottom surface of the fan attached to the heat sink, a hollow second connecting portion extending from the body and being connected to an opposite end of the flexible pipe.

8. The heat dissipation system as described in claim 7, wherein the heat sink has a plurality of fins and a channel defined through the fins.

9. The heat dissipation system as described in claim 7, wherein the catches are accommodated in the channel of the heat sink.

* * * * *